United States Patent [19]
Medow
[11] 4,402,151
[45] Sep. 6, 1983

[54] VISUAL DISPLAY ARRANGEMENT

[76] Inventor: Robert S. Medow, 5369 Trowbridge Dr., Dunwoody, Ga. 30338

[21] Appl. No.: 308,097

[22] Filed: Oct. 5, 1981

[51] Int. Cl.[3] .................. G09F 23/00; A63H 33/26; H01R 4/02; H05K 1/00

[52] U.S. Cl. .................. 40/569; 46/28; 46/227; 40/541; 40/605; 339/96; 339/97 R; 339/17 LM; 339/17 M; 339/17 E

[58] Field of Search .................. 40/568, 569, 553, 579, 40/124.5, 427, 152, 541, 571, 605; 428/7, 8, 9; 339/96, 97 R, 17 E, 17 M, 17 N, 17 LM; 46/25, 28, 30, 227

[56] References Cited

U.S. PATENT DOCUMENTS

| | | | |
|---|---|---|---|
| 1,067,024 | 7/1913 | Hall et al. | 339/96 |
| 2,295,188 | 9/1942 | Starnes | 40/130 |
| 2,508,250 | 5/1950 | Goffstein | 40/130 |
| 2,808,671 | 10/1957 | Smith et al. | 40/569 |
| 3,152,288 | 10/1964 | Mittler | 339/17 E |
| 3,237,341 | 3/1966 | Janning | 46/16 |
| 3,318,993 | 5/1967 | Beelitz | 339/17 E |
| 3,446,953 | 5/1969 | Mylonas | 240/10 |
| 3,452,456 | 7/1969 | Tinman | 35/34 |
| 3,460,282 | 8/1969 | Swirsky | 40/152 |
| 3,860,317 | 1/1975 | Williams et al. | 339/96 |
| 3,873,885 | 3/1975 | Elverson | 339/96 |
| 4,115,938 | 9/1978 | Belmuth et al. | 40/152 |
| 4,276,705 | 7/1981 | Barth et al. | 40/579 |

*Primary Examiner*—Robert Peshock
*Assistant Examiner*—Michael J. Foycik
*Attorney, Agent, or Firm*—Oltman and Flynn

[57] ABSTRACT

The present visual display arrangement has a display panel with two electrically conductive layers separated by a dielectric support panel, and a visual display layer on the front of the display panel. One or more lamps have prongs of different lengths for contact respectively with the conductive layers in the display panel. Each lamp completes an electrical circuit for the conductive layers which also includes a power source and a switch for turning the inserted lamp or lamps on and off.

4 Claims, 8 Drawing Figures

FIG. 1
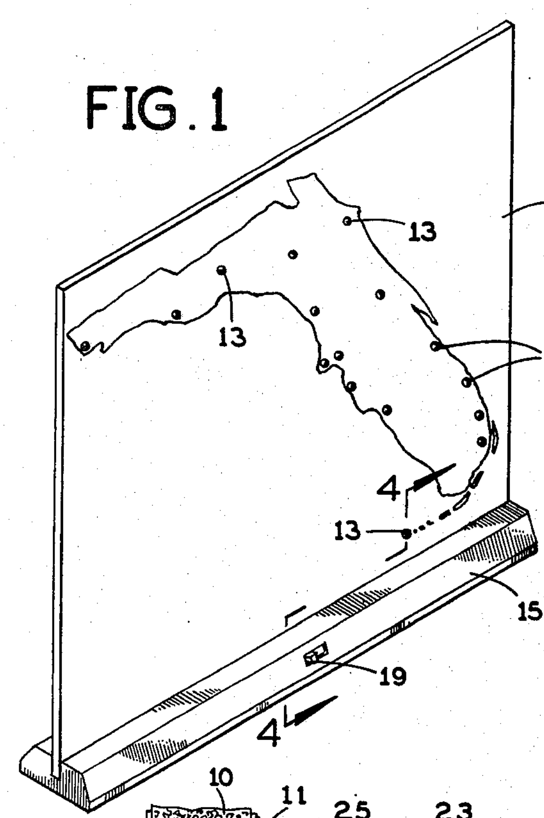
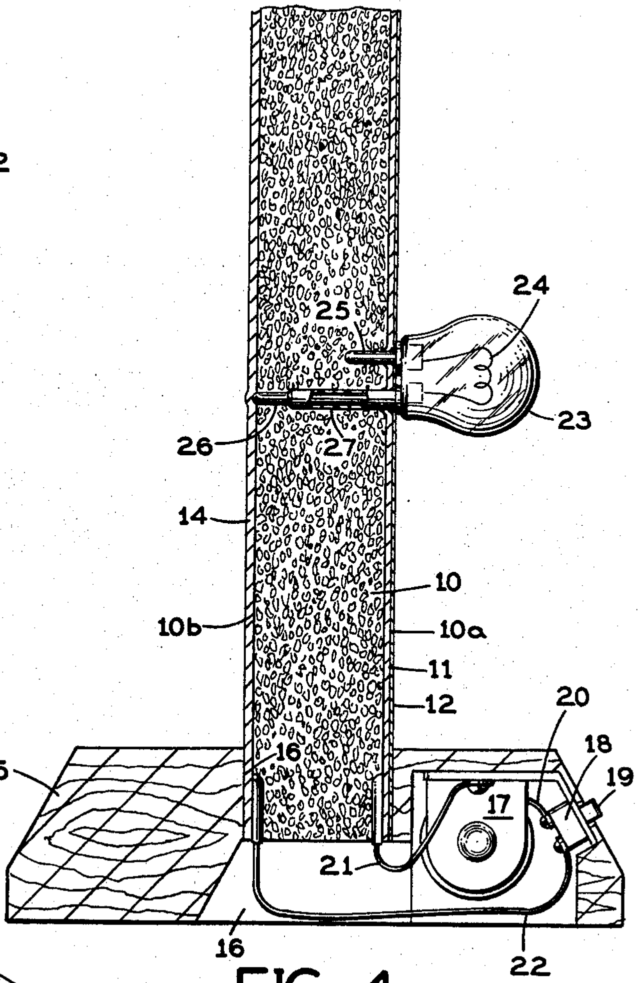
FIG. 4
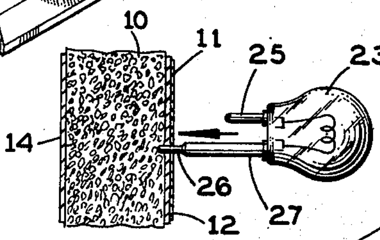
FIG. 3
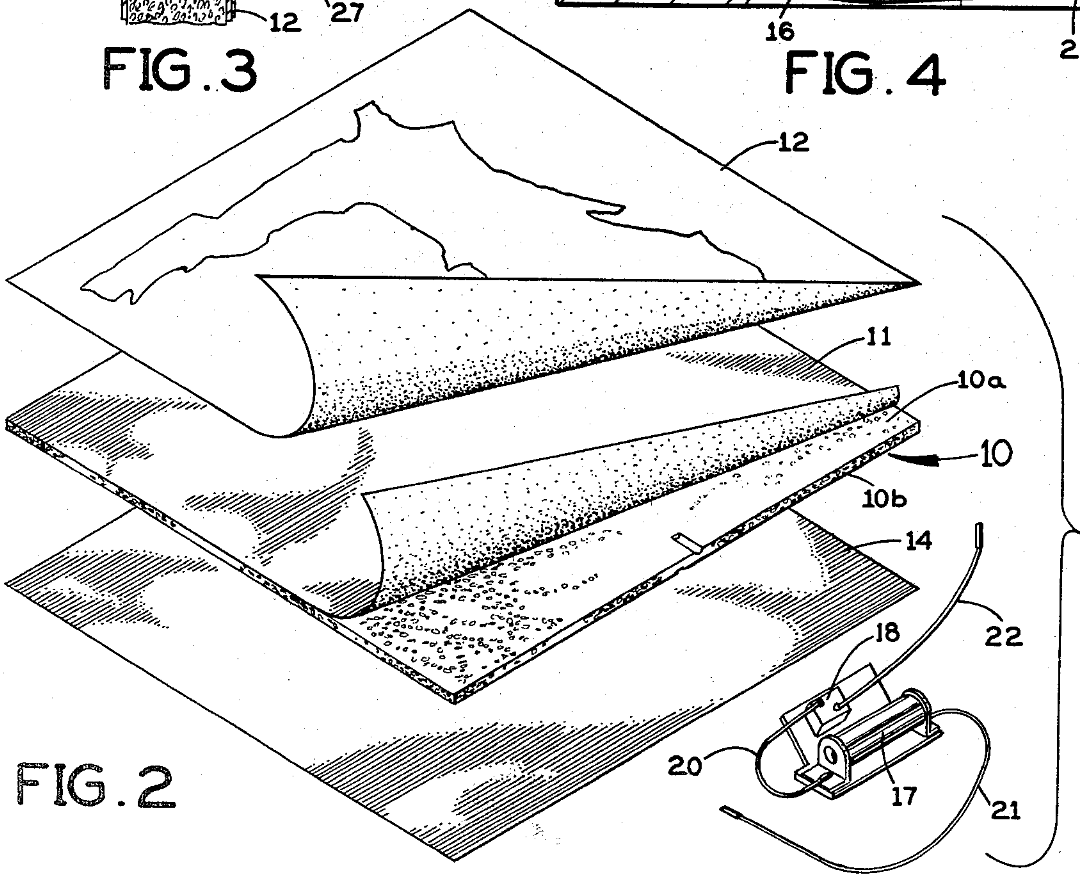
FIG. 2

VISUAL DISPLAY ARRANGEMENT

SUMMARY OF THE INVENTION

This invention relates to a visual display arrangement having a display panel and one or more lamps which are manually insertable at selected locations on the display panel to highlight what is displayed there. The display panel has separate electrically conductive layers which are insulated from each other by a thickness of dielectric material and are contacted respectively by the prongs of a lamp inserted into the panel. The inserted lamp completes an electrical circuit which includes the conductive layers as well as a power source and a manual switch for turning the inserted lamps on and off.

The display panel may have just two such electrically conductive layers or it may have three or more connected in pairs in separate switch-controlled circuits for greater versatility in the operation of the visual display.

If desired, several display panels may be fitted together to form a large area display having the electrically conductive layers in each panel contacting the corresponding conductive layers in neighboring panels.

The present display arrangement is particularly advantageous for selectively highlighting selected locations on maps, business or other plans, production schedules or various decorative or informational displays.

A principal object of this invention is to provide a novel visual display arrangement which enables selected areas to be emphasized by turning on lamps located there.

Another object of this invention is to provide a novel visual display arrangement having a display panel with electrically conductive layers in an electrical circuit which is completed by the insertion of one or more lamps into the panel at locations selected to be highlighted by those lamps.

Further objects and advantages of the present invention will be apparent from the following detailed description of three presently-preferred embodiments thereof, shown in the accompanying drawings.

DESCRIPTION OF THE DRAWINGS

FIG. 1 is a front perspective view of a display panel in accordance with a first embodiment of this invention having a single electrical circuit for the display lamps;

FIG. 2 is an exploded perspective view showing the components of this display panel plus a battery and a manual switch;

FIG. 3 is a fragmentary cross-section through the display panel with the prongs of a lamp being inserted into the panel;

FIG. 4 is a fragmentary section taken along the line 4—4 in FIG. 1 showing a lamp with its prongs fully inserted into the display panel;

Figure 5:
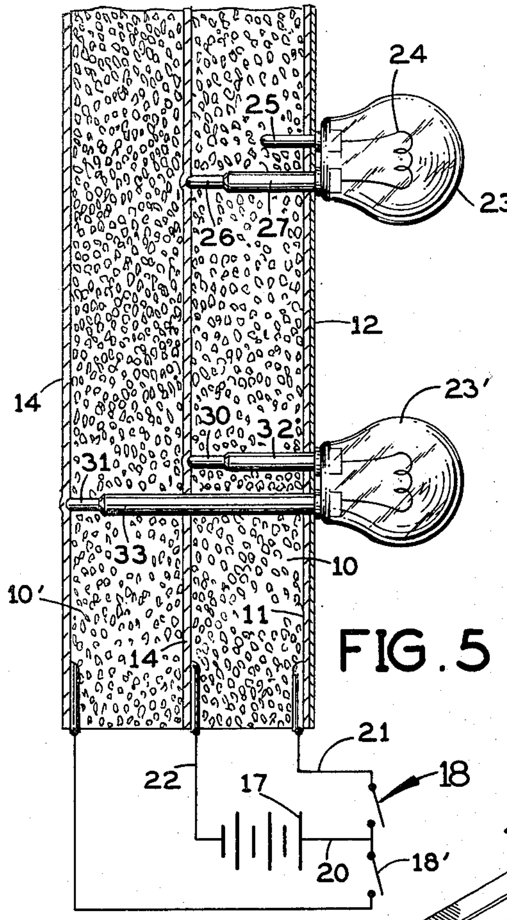
FIG. 5 is a fragmentary section generally similar to FIG. 4 and showing a second embodiment of the invention which has two electrical circuits for different sets of display lamps.

Before explaining the disclosed embodiments of the present invention in detail, it is to be understood that the invention is not limited in its application to the details of the particular arrangements shown since the invention is capable of other embodiments. Also, the terminology used herein is for the purpose of description and not of limitation.

DETAILED DESCRIPTION

Referring first to FIGS. 1-4, in this embodiment the display arrangement comprises a substantially rigid support panel member 10 of suitable dielectric material into which the prongs of a lamp can be easily inserted manually. For example, the material may be cork, cardboard or expanded foam plastic, such as polystyrene. The support panel member presents a flat, broad area, rectangular front face 10*a* and a similar rear face 10*b* extending parallel to the front face.

Adhesively bonded to the front face 10*a* of the support panel member is a first conductive layer 11 in the form of a thin sheet or foil of electrically conductive material which, in the embodiment shown, extends across the complete area of this face of the panel member. A visual display layer in the form of a thin sheet 12 of paper, rubber, vinyl or self-sealing material is adhesively bonded to the front or outer face of the conductive sheet 11. In the particular embodiment shown in FIGS. 1 and 4, this display layer shows a map or sketch of the state of Florida which may have its major cities represented by discrete spots 13, as shown in FIG. 1.

A second conductive layer 14 in the form of a thin sheet or foil of electrically conductive material is adhesively bonded to the rear face 10*b* of the support panel member 10 and extends completely across it parallel to the first conductive sheet 11 on its front face.

The support panel member 10, front and rear conductive layers 11 and 14, and visual display layer 12 together constitute a unitary display panel which extends up from a base 15 with a horizontal bottom surface enabling it to rest on a table, floor or other horizontal surface. As shown in FIG. 4, the base presents a recess 16 about midway along its length in which a battery 17 and a manually operated switch 18 are mounted. The switch is operated by a knob 19 which is accessible at the front of the base, as shown in FIG. 1. One terminal of the battery 17 is connected by a lead wire 20 (FIG. 4) to one terminal of the switch 18. The opposite battery terminal is connected by a lead wire 21 to the conductive layer 11 on the front of support panel member 10. The opposite terminal of switch 18 is connected by a lead wire 22 to the rear conductive layer 14. Normally, the electrical circuit which includes the battery 17, switch 18, lead wires 20, 21 and 22, and conductive layers 11 and 14 is open-circuited by the dielectric material of the panel member 10 between the conductive layers 11 and 14.

The display arrangement also includes a set of one or more light bulbs 23 which may be inserted into the display panel and supported by it at any desired location on the display layer 12, such as one or more of the city locations 13 in FIG. 1. Each bulb has an incandescent filament 24, one terminal of which is connected to a short metal prong 25 and the other terminal of which is connected to a longer metal prong 26 which is covered by an electrical insulation sheath 27 except at its free end away from the bulb. When the prongs are pushed into the display panel, as indicated by the arrow in FIG. 3, the longer prong 26 pierces the display layer 12, the front conductive layer 11 and the material of the support panel member 10 unit its bare metal free end contacts the rear conductive layer 14. The shorter prong 25 pierces the display layer 12 and the front conductive layer 11 and penetrates part way through the thickness of the support panel member 10. This leaves the lamp 23 positioned as shown in FIG. 4, with its base directly in front of the display layer 12. The shorter prong 25 of the lamp makes metal-to-metal contact with the front conductive layer 11. The longer lamp prong 26 is insulated from the front conductive layer 11 by its dielectric sheath 27 and makes metal-to-metal contact with the rear conductive layer 14. Thus, the lamp completes the electrical circuit of the display and the lamp will be turned on whenever the switch 18 is closed.

If more than one lamp at a time is mounted on the display panel, the lamps will be electrically in parallel and all will be illuminated when switch 18 is closed.

If desired, the two conductive layers 11 and 14 may extend only over the area of the visual display layer 12 where the user is likely to insert a lamp bulb to emphasize a particular part of the visual display, for example, the land area in FIG. 1.

FIG. 5 illustrates a second embodiment of the invention which is designed to accommodate two sets of lamps, either set of which may be on while the other set is off at any given moment in the presentation of the display.

As shown in FIG. 5, a second support panel member 10' similar to panel member 10 is adhesively bonded to the rear face of the conductive layer 14 on the back of panel member 10. A conductive layer 14' is bonded to the rear face of the second panel member 10'. The electrical circuit includes a second switch 18' connected between the battery 17 and the conductive layers 14 and 14'. Thus two electrical circuits are connected across the battery 17, one including the first switch 18 and the conductive layers 11 and 14, and the other including the second switch 18' and the conductive layers 14 and 14'.

The second circuit can be completed by a second lamp 23' having two metal prongs 30 and 31. The shorter prong 30 on this lamp is identical to the longer prong 26 on the first lamp 23. Except at its free end, prong 30 is covered by a dielectric sheath 32 which insulates it from the front conductive layer 11 on the display panel. The longer prong 31 on lamp 23' is covered by a dielectric sheath 33 except at its free end. This sheath insulates prong 33 from both the front conductive layer 11 and what is now the intermediate conductive layer 14 in the display panel. From FIG. 5 it will be evident that when the second lamp 23' is mounted on the display panel its shorter prong 30 makes metal-to-metal contact with the intermediate conductive layer 14 and its longer prong 31 makes metal-to-metal contact with the rear conductive layer 14'.

With this arrangement, whenever switch 18 is closed the lamp 23 is turned on, and whenever the other switch 18' is closed the lamp 23' is turned on. Obviously, there may be more than one lamp 23 mounted on the display panel at different locations which are controlled by switch 18, and there may be more than one lamp 23' at other locations which are controlled by switch 18'.

It will apparent that the multiple switch arrangement illustrated by FIG. 5 may be extended by adding additional dielectric support panel members, each with its own rear conductive layer, to the two panel construction shown in FIG. 5. In that event, an additional switch would be provided for each additional support panel member and the additional set of lamps for the additional support panel member would have correspondingly longer prongs so as to bridge the two conductive layers associated with that panel member.

Figure 6:
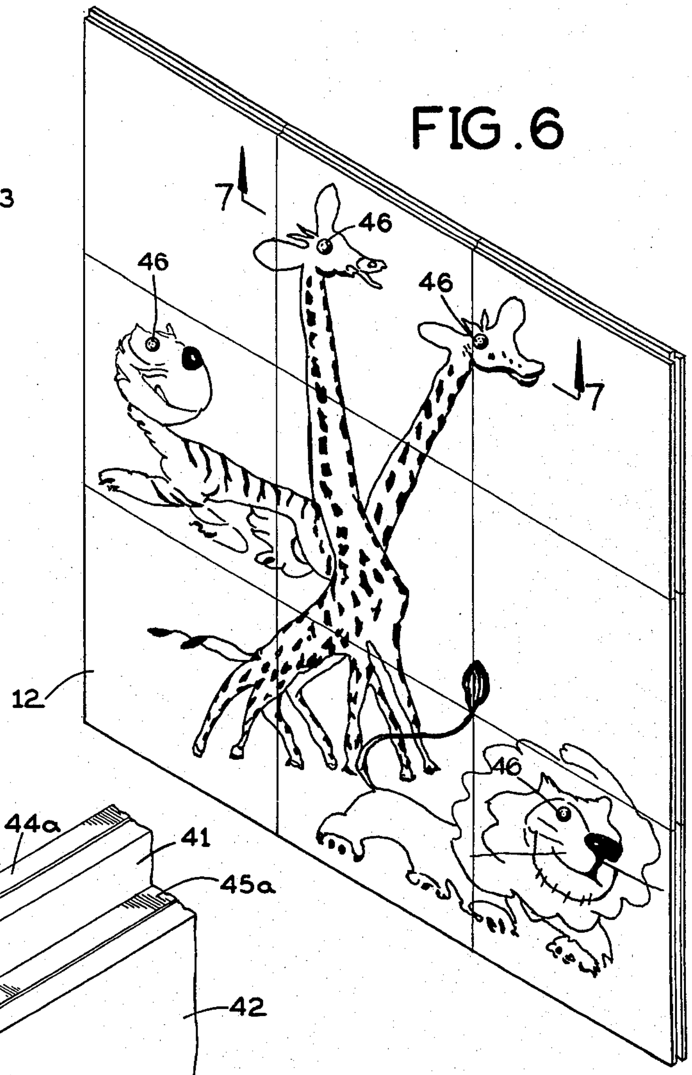
FIG. 6 is a perspective view of a third embodiment of the invention having several display panels interconnected structurally and electrically to provide a single display arrangement.
Figure 8:
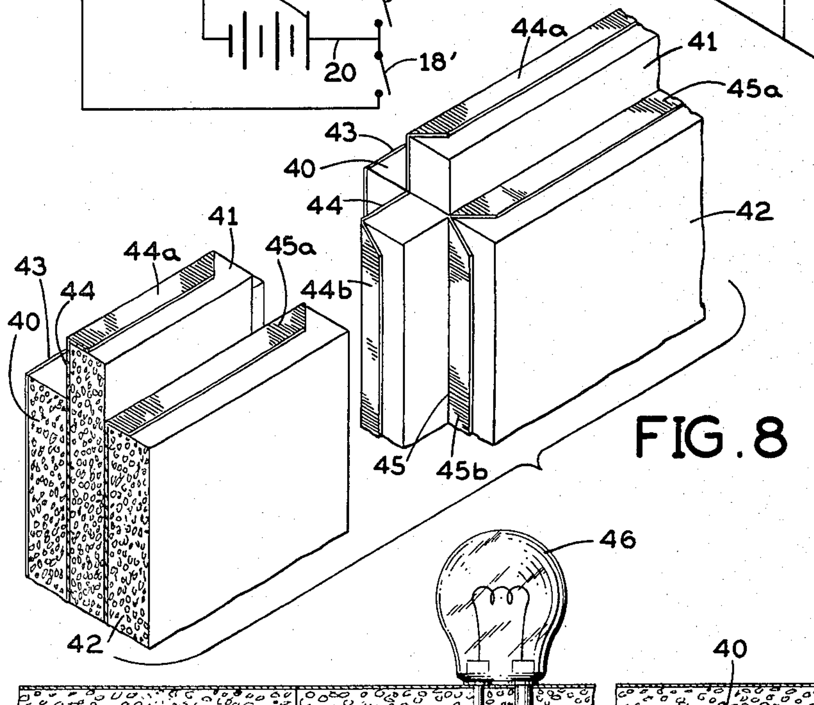
FIG. 8 is a fragmentary exploded perspective showing the tongue-and-groove connection between adjoining panels in FIG. 6.
Figure 7:
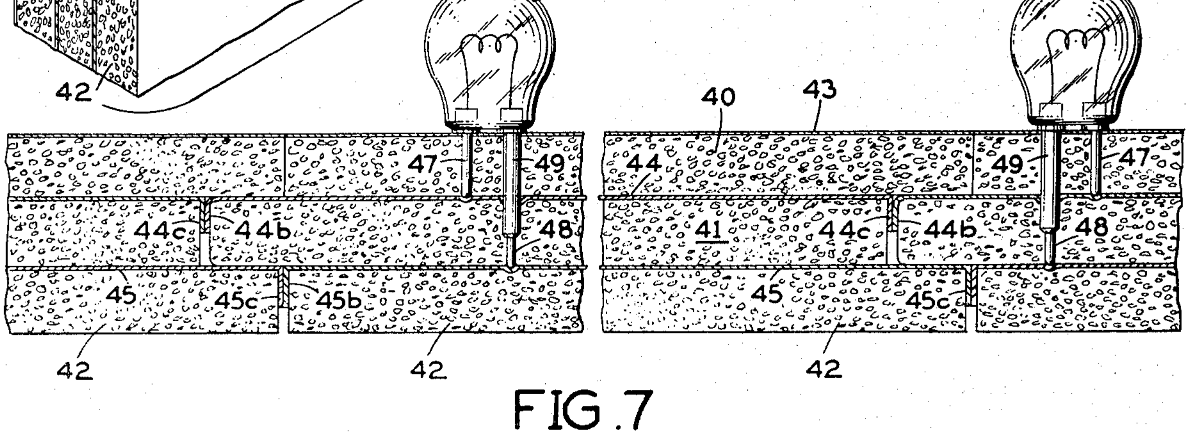
FIG. 7 is a horizontal section taken along the line 7—7 in FIG. 6.

FIGS. 6–8 illustrate a third embodiment of the invention which is particularly advantageous where the pictorial display extends over a broader area than can be conveniently provided by a single panel. In FIG. 6, the complete display panel assembly consists of nine individual panels interconnected at tongue-and-groove joints along adjoining edges to make up the complete display panel assembly. Each of the nine panels has a laminated construction as shown in FIGS. 7 and 8.

Referring to FIG. 7, this laminated construction includes three dielectric support panel members 40, 41 and 42, each like the panel member 10 in FIGS. 2–4. The visual display layer 43 covers the front face of the front panel member 40. A first electrically conductive layer 44 is sandwiched between the rear face of the front support panel member 40 and the front face of the intermediate support panel member 41. A second electrically conductive layer 45 is sandwiched between the rear face of the intermediate panel member 41 and the front face of the rear panel member 42.

The intermediate panel member 41 is offset both horizontally and vertically from the front and rear panel members 40 and 42 so as to present an upwardly projecting tongue at the top and a groove at the bottom and a laterally projecting tongue along its right edge (viewed from the front) and a groove along its left edge. This construction enables adjoining panels to interfit laterally as shown in FIG. 7 and also vertically.

As shown in FIG. 8 the first conductive layer 44 is folded back at 44*a* over the upwardly offset top edge of the intermediate panel member 41 and is folded back at 44*b* across the laterally offset right side edge (viewed from the front) of this panel member. The conductive layer 44 also is folded back over the left edge at 44*c* (FIG. 7) and the bottom edge (not shown) of panel member 41. Similarly, the second conductive layer 45 is folded back at 45*a* over the top edge of the rear panel member 42 and is folded back at 45*b* across the right edge (viewed from the front) of this panel member. The conductive layer 45 also is folded back over the opposite side edge at 45*c* (FIG. 7) and across the bottom edge (not shown).

Since all of the panels are identical, the folded-over segment 44*b* of the first conductive layer 44 in each panel is in direct engagement with the folded-over segment 44*c* in layer 44 in the next panel to the right (viewed from the front). Also, the folded-over segment 44*a* at the top of the first conductive layer 44 in each panel directly engages the folded-over segment of layer 44 on the bottom of the next panel above. With this arrangement all of the first conductive panels 44 in the assembly of nine adjoining panels form a continuous conductor.

The same is true of the second conductive layers 45 in the adjoining panels which engage each other at their folded-over edges to form a continuous conductor.

Thus, the adjoining panels interfit structurally at tongue-and-groove joints along their edges and together they present two conductive layers 44 and 45, each of which extends across the complete area of the panel assembly.

Light bulbs 46 as shown in FIG. 7 may be mounted at selected locations on the panel assembly. Each light bulb has a short prong 47 and a longer prong 48 which easily penetrate the panel. The short prong 47 makes metal-to-metal contact with the first conductive layer 44 and the longer prong 48 makes metal-to-metal contact with the second conductive layer 45 when the lamp is mounted in place directly in front of the display layer 43 on the corresponding panel. The longer prong 48 carries a dielectric sheath 49 which insulates it from the first conductive layer 44 where it penetrates the latter. The conductive layers 44 and 45 are connected to a battery and switch as already described so that whenever the switch is closed all of the lamps mounted on the panel assembly as shown FIG. 7 are turned on.

From the foregoing description and the accompanying drawings it will be evident that the present display arrangement enables selected areas of a pictorial or other display surface to be emphasized by the presence of manually insertable and removable lamps whose prongs contact electrically conductive layers in the display panel to complete an electrical circuit.

I claim:

1. A visual display arrangement comprising a plurality of substantially rigid display panels interconnected along adjoining edges in substantially edge-to-edge engagement by tongue-and-groove joints to form a single continuous substantially rigid display panel assembly, each of said display panels comprising:

first and second electrically conductive layers separated by a thickness of dielectric material, and a visual display layer on the side of said display panel closer to said first electrically conductive layer than to said second electrically conductive layer;

a set of one or more lamps each having a pair of electrically conductive rigid terminals which are manually insertable into said display panel to mount the lamp in front of said visual display layer;

one of said pair of lamp terminals being long enough to penetrate said first electrically conductive layer and to extend into said dielectric material without contacting said second electrically conductive layer when the lamp is mounted in front of said visual display layer;

the other of said lamp terminals being long enough to extend through said dielectric material into contact with said second electrically conductive layer when the lamp is mounted in front of said visual display layer, a dielectric sheath on said other terminal insulating it from said first electrically conductive layer;

and circuit means for connecting said electrically conductive layers across an electrical power source, said circuit means including selectively operable switch means for controlling the energization of the lamps mounted on the display panel.

2. A visual display arrangement according to claim 1, wherein each of said electrically conductive layers in each display panel is folded over the edge of that panel at each tongue-and-groove joint in the panel assembly to contact the corresponding electrically conductive layer in each adjoining display panel.

3. A visual display arrangement according to claim 2, wherein each display panel comprises:

first and second dielectric support panel members;

a first electrically conductive layer sandwiched between said first and second support panel members;

a third dielectric support panel member located on the opposite side of said second support panel member from said first support panel member;

a second electrically conductive layer sandwiched between said second and third support panel members;

said second support panel member being offset from said first and third support panel members to form an outwardly projecting tongue and groove at opposite edges of the display panel;

and a display layer extending across the opposite side of said first support panel member from said second support panel member.

4. A visual display arrangement comprising a plurality of display panels interconnected along adjoining edges by tongue-and-groove joints to form a single continuous display panel assembly, each of said display panels comprising:

first and second dielectric support panel members;

a first electrically conductive layer sandwiched between said first and second support panel members;

a third dielectric support panel member located on the opposite side of said second support panel member from said first support panel member;

a second electrically conductive layer sandwiched between said second and third support panel members;

said second support panel member being offset from said first and third support panel members to form an outwardly projecting tongue and groove at opposite edges of the display panel;

a display layer extending across the opposite side of said first support panel member from said second support panel member;

each of said electrically conductive layers in each display panel being folded over the edge of that panel at each tongue-and-groove joint in the panel assembly to contact the corresponding electrically conductive layer in each adjoining display panel;

and circuit means for connecting said electrically conductive layers across an electrical power source, said circuit means including selectively operable switch means for controlling the energization of lamps mounted on the display panel and having terminals which respectively engage said first and second electrically conductive layers.

* * * * *